United States Patent
Onomura

(10) Patent No.: US 10,910,489 B2
(45) Date of Patent: Feb. 2, 2021

(54) SEMICONDUCTOR DEVICE

(71) Applicants: Kabushiki Kaisha Toshiba, Minato-ku (JP); Toshiba Electronic Devices & Storage Corporation, Minato-ku (JP)

(72) Inventor: Masaaki Onomura, Setagaya (JP)

(73) Assignees: Kabushiki Kaisha Toshiba, Minato-ku (JP); Toshiba Electronic Devices & Storage Corporation, Minato-ku (JP)

(*) Notice: Subject to any disclaimer, the term of this patent is extended or adjusted under 35 U.S.C. 154(b) by 38 days.

(21) Appl. No.: 16/458,670

(22) Filed: Jul. 1, 2019

(65) Prior Publication Data
US 2020/0287035 A1    Sep. 10, 2020

(30) Foreign Application Priority Data
Mar. 7, 2019    (JP) ................................ 2019-041385

(51) Int. Cl.
     *H01L 29/778*      (2006.01)
     *H01L 29/15*       (2006.01)
     (Continued)

(52) U.S. Cl.
     CPC ...... *H01L 29/7785* (2013.01); *H01L 21/0254* (2013.01); *H01L 21/0262* (2013.01);
     (Continued)

(58) Field of Classification Search
     CPC ............... H01L 29/7785; H01L 29/155; H01L 29/2003; H01L 29/205; H01L 29/4236;
     (Continued)

(56) References Cited

U.S. PATENT DOCUMENTS

| | | | |
|---|---|---|---|
| 2010/0229788 A1* | 9/2010 | Lo | ..................... H01L 21/02458 117/87 |
| 2012/0043528 A1* | 2/2012 | Lo | ....................... H01L 21/0254 257/28 |

(Continued)

FOREIGN PATENT DOCUMENTS

| | | |
|---|---|---|
| JP | 2018-509754 | 4/2018 |
| JP | 2018-509755 | 4/2018 |
| JP | 2018-520499 | 7/2018 |

*Primary Examiner* — Shaun M Campbell
(74) *Attorney, Agent, or Firm* — Oblon, McClelland, Maier & Neustadt, L.L.P.

(57) ABSTRACT

A semiconductor device according to an embodiment includes: a substrate; a first nitride semiconductor layer that is provided above the substrate, has a first lattice period in a first direction parallel to a substrate plane, and includes nitrogen and aluminum; a second nitride semiconductor layer that is provided between the substrate and the first nitride semiconductor layer and includes nitrogen and aluminum and of which at least a portion has a second lattice period that is three times the first lattice period in the first direction parallel to the substrate plane; a third nitride semiconductor layer provided above the first nitride semiconductor layer; a fourth nitride semiconductor layer that is provided on the third nitride semiconductor layer and has a larger bandgap than the third nitride semiconductor layer; at least one main electrode provided on the fourth nitride semiconductor layer; and a control electrode provided above the third nitride semiconductor layer, the control electrode being configured to control a current of the semiconductor device.

15 Claims, 5 Drawing Sheets

(51) Int. Cl.

| | |
|---|---|
| *H01L 29/20* | (2006.01) |
| *H01L 29/205* | (2006.01) |
| *H01L 29/423* | (2006.01) |
| *H01L 21/02* | (2006.01) |
| *H01L 29/66* | (2006.01) |

(52) U.S. Cl.
CPC .. *H01L 21/02381* (2013.01); *H01L 21/02433* (2013.01); *H01L 21/02458* (2013.01); *H01L 21/02507* (2013.01); *H01L 21/02661* (2013.01); *H01L 29/155* (2013.01); *H01L 29/2003* (2013.01); *H01L 29/205* (2013.01); *H01L 29/4236* (2013.01); *H01L 29/66462* (2013.01)

(58) Field of Classification Search
CPC ......... H01L 29/66462; H01L 21/02381; H01L 21/02433; H01L 21/02458; H01L 21/02507; H01L 21/0254; H01L 21/0262; H01L 21/02661
See application file for complete search history.

(56) References Cited

U.S. PATENT DOCUMENTS

| | | | |
|---|---|---|---|
| 2013/0026482 A1* | 1/2013 | Fenwick | H01L 21/0262 257/76 |
| 2013/0032781 A1* | 2/2013 | Miyoshi | H01L 21/02458 257/18 |
| 2016/0359004 A1 | 12/2016 | Su et al. | |
| 2018/0012753 A1 | 1/2018 | Semond et al. | |
| 2018/0019120 A1 | 1/2018 | Semond et al. | |

\* cited by examiner

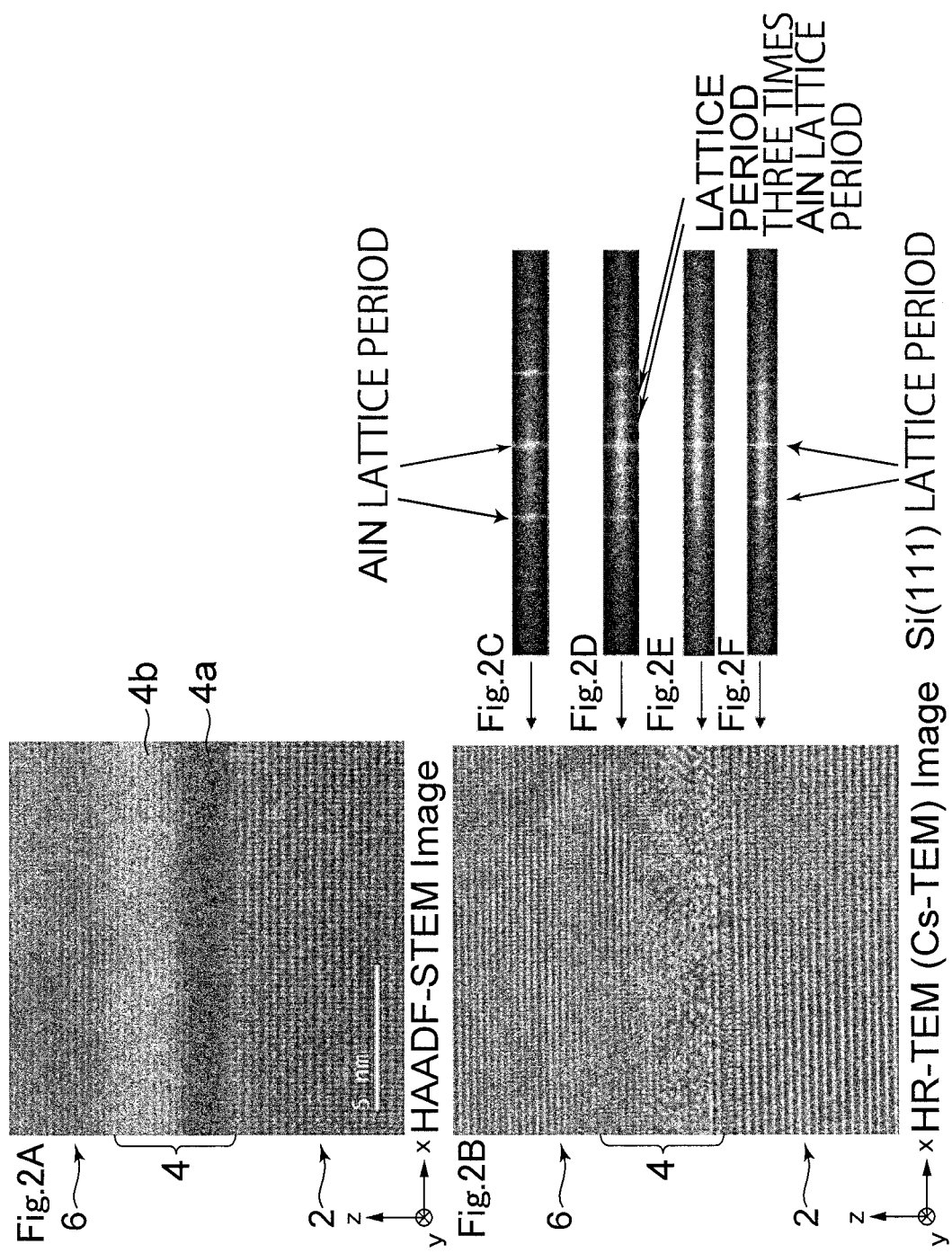

60 degrees

SEMICONDUCTOR DEVICE

CROSS-REFERENCE TO RELATED APPLICATION

This application is based upon and claims the benefit of priority from Japanese Patent Application No. 2019-041385, filed on Mar. 7, 2019, the entire contents of which are incorporated herein by reference.

FIELD

Embodiments described herein relate generally to Semiconductor Device.

BACKGROUND

In a switching element, a so-called GaN-on-Si technique that forms a nitride semiconductor on a Si substrate has been developed. The Si substrate is inexpensive and the diameter of the Si substrate has been increased. Therefore, the Si substrate can be massively produced at a low cost. In addition, the Si substrate has a function of reducing the electric field and can gain heat dissipation without any practical problems. Therefore, the Si substrate is expected as a switching element substrate.

However, in a case in which a nitride semiconductor is formed on the Si substrate, the lattice mismatch between Si and the nitride semiconductor and a difference in thermal expansion coefficient between Si and the nitride semiconductor occur. For example, while the lattice constant of the (0001) face of aluminum nitride (AlN) in the direction of the a-axis is 0.3111 nm, the lattice constant of the (111) face of Si is 0.3840 nm. Therefore, there is a problem that the 19% lattice mismatch between Si and GaN causes the occurrence of threading dislocation in the nitride semiconductor layer at a density of $1 \times 10^9$ cm$^{-2}$ or more. In addition, the difference between the thermal expansion coefficient of Si and the thermal expansion coefficient of GaN is about 60% and is significantly large. Therefore, in a case in which the temperature returns to room temperature after epitaxial growth, large warpage in a lower convex direction occurs in a wafer in which a nitride semiconductor is epitaxially grown on a Si substrate in a high temperature environment due to strain stress caused by the lattice mismatch and the difference between the thermal expansion coefficients. In addition, cracks are likely to occur in the nitride semiconductor layer or the Si substrate. These problems make it difficult to obtain high-quality nitride semiconductors with few threading dislocations and wafers are likely to be broken during a process for forming electrodes.

BRIEF DESCRIPTION OF THE DRAWINGS

FIGS. 2A to 2F are diagrams illustrating the analysis results of the cross sections of a substrate, a second nitride semiconductor layer, and a first nitride semiconductor layer in the semiconductor device according to the embodiment;

DETAILED DESCRIPTION

Figure 1:
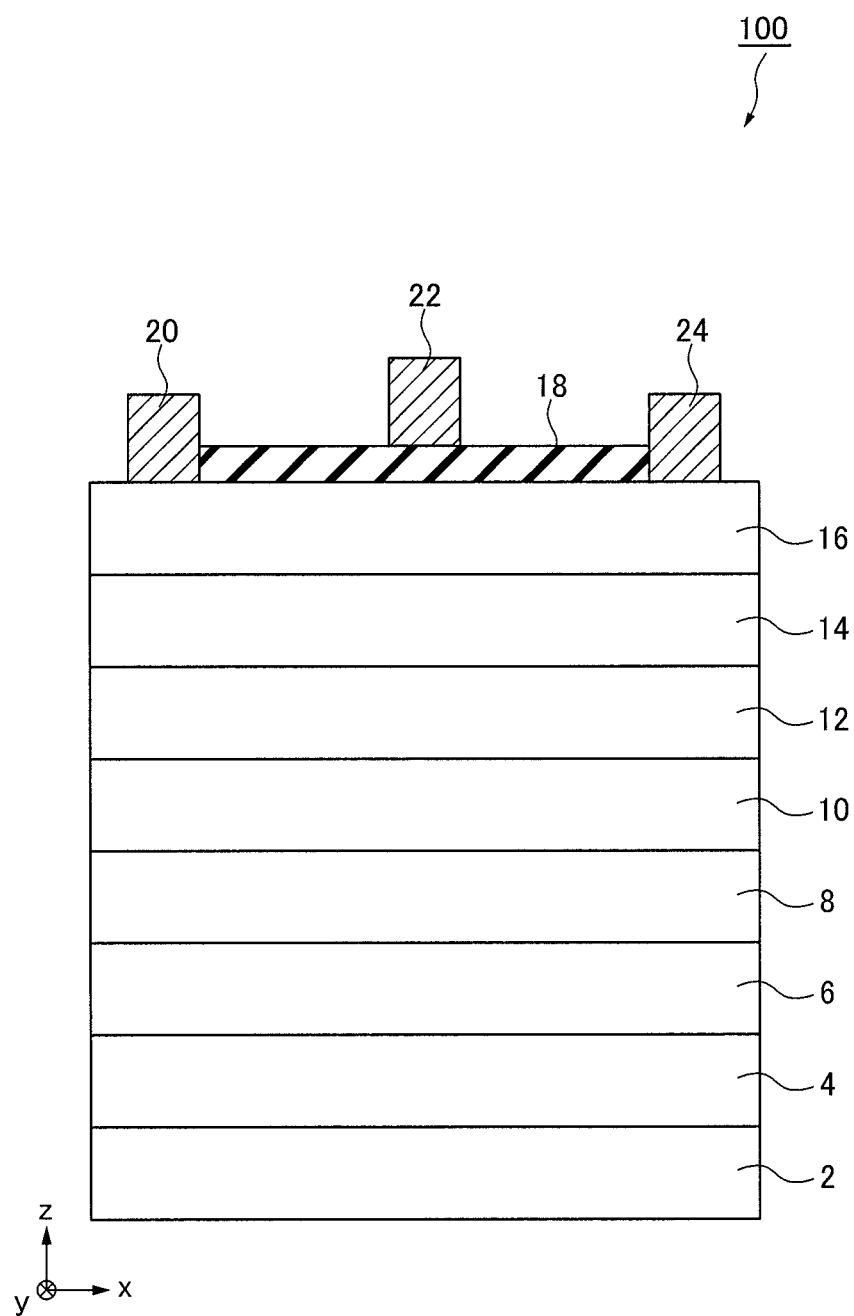
FIG. 1 is a cross-sectional view schematically illustrating a semiconductor device according to an embodiment.

Hereinafter, embodiments will be described with reference to the drawings. In the drawings, the same or similar components are denoted by the same or similar reference numerals.

In the present specification, the same or similar members will be denoted by the same reference numerals, and redundant descriptions may be omitted.

In the specification, a "nitride semiconductor" is a generic term of a group-III nitride semiconductor including $Al_x Ga_{1-x-y} In_y N$ ($0 \leq x \leq 1$, $0 \leq y \leq 1$, $0 \leq x+y \leq 1$).

In the specification, in order to indicate the positional relationship of parts and the like, the upper direction of the drawing is described as "upper" and the lower direction of the drawing as "lower". In the specification, the terms "upper" and "lower" are not necessarily terms indicating the relationship with the direction of gravity.

Embodiment

A semiconductor device according to an embodiment includes: a substrate; a first nitride semiconductor layer provided above the substrate, the first nitride semiconductor layer having a first lattice period in a first direction parallel to a substrate plane, the first nitride semiconductor layer including nitrogen and aluminum; a second nitride semiconductor layer provided between the substrate and the first nitride semiconductor layer, at least a portion of the second nitride semiconductor layer having a second lattice period in the first direction parallel to the substrate plane, the second lattice period being three times the first lattice period, the second nitride semiconductor layer including nitrogen and aluminum; a third nitride semiconductor layer provided above the first nitride semiconductor layer; a fourth nitride semiconductor layer provided on the third nitride semiconductor layer, the fourth nitride semiconductor layer having a larger bandgap than the third nitride semiconductor layer; at least one main electrode provided on the fourth nitride semiconductor layer; and a control electrode provided above the third nitride semiconductor layer, the control electrode being configured to control a current of the semiconductor device.

FIG. 1 is a cross-sectional view schematically illustrating a semiconductor device 100 according to this embodiment. The semiconductor device 100 according to this embodiment is a semiconductor device that is called a normally-on hetero field effect transistor (HFET) or a high electron mobility transistor (HEMT) using a nitride semiconductor.

The semiconductor device 100 includes a substrate 2, a second nitride semiconductor layer 4, a first nitride semiconductor layer 6, an AlGaN layer 8 (an example of a seventh nitride semiconductor layer), an AlN/GaN superlattice semiconductor layer 10 (an example of a sixth nitride semiconductor layer), a GaN high-resistance layer 12 (an example of a fifth nitride semiconductor layer), a third nitride semiconductor layer 14, a fourth nitride semiconductor layer 16, an insulating film 18, a source electrode 20, a gate electrode 22, and a drain electrode 24.

Here, the x-axis, the y-axis perpendicular to the x-axis, and the z-axis perpendicular to the x-axis and the y-axis are defined. It is assumed that a plane of the substrate 2 is disposed in parallel to the xy plane.

The substrate 2 is, for example, a Si substrate. It is preferable that the plane direction of the substrate 2 is Si (111). In a case in which the substrate 2 is, for example, an 8-inch Si (111) substrate, the thickness of the substrate 2 is preferably 725 µm and may be greater than 725 µm.

The first nitride semiconductor layer 6 is provided above the substrate 2. The first nitride semiconductor layer 6 includes nitrogen (N) and aluminum (Al). The first nitride semiconductor layer 6 is preferably, for example, an AlN layer, but is not limited thereto. The thickness of the first nitride semiconductor layer 6 is, for example, about 200 nm.

The second nitride semiconductor layer 4 is provided between the substrate 2 and the first nitride semiconductor layer 6. In other words, the second nitride semiconductor layer 4 is provided on the substrate 2. The first nitride semiconductor layer 6 is provided on the second nitride semiconductor layer 4. The second nitride semiconductor layer includes N and Al. The thickness of the second nitride semiconductor layer is preferably equal to or less than 10 nm and more preferably equal to or less than 5 nm.

The AlGaN layer 8 is provided on the first nitride semiconductor layer 6. The AlGaN layer 8 is a buffer layer for reducing the lattice mismatch between the first nitride semiconductor layer 6 and a layer above the AlN/GaN superlattice semiconductor layer 10 which will be described below. Specifically, the AlGaN layer 8 can be made of, for example, $Al_{0.6}Ga_{0.4}N$. However, the material forming the AlGaN layer 8 is not limited thereto. In addition, the AlGaN layer 8 may have a stacked structure of layers with different Al compositions or may not be formed, according to the specification of the semiconductor device. The thickness of the AlGaN layer 8 is, for example, 150 nm.

The AlN/GaN superlattice semiconductor layer 10 is provided on the AlGaN layer 8. The AlN/GaN superlattice semiconductor layer 10 has a stacked structure for reducing the electric field applied between the substrate 2 and the drain electrode 24 which will be described below. The AlN/GaN superlattice semiconductor layer 10 includes AlN with a large bandgap of 6.2 eV. Therefore, since the AlN/GaN superlattice semiconductor layer 10 is provided, element breakdown in an epitaxial growth direction is less likely to occur in the semiconductor device 100. In addition, the AlN/GaN superlattice semiconductor layer 10 may have a stacked structure of a plurality of layers with different compositions or thicknesses or may not be formed, according to the specification of the semiconductor device. The AlN/GaN superlattice semiconductor layer 10 is formed by, for example, alternately stacking an AlN film with a thickness of 10 nm and a GaN film with a thickness 25 nm 100 times.

The GaN high-resistance layer 12 is provided on the AlN/GaN superlattice semiconductor layer 10. The GaN high-resistance layer 12 includes, for example, carbon (C) of about $1 \times 10^{19}$ cm$^{-3}$. In general, a nitride semiconductor includes many residual impurities and also has point defects or dislocation defects. Therefore, in general, even in a case in which a nitride semiconductor is undoped, the nitride semiconductor is an n-type semiconductor with a carrier concentration of about $1 \times 10^{17}$ cm$^{-3}$. However, the nitride semiconductor is doped with the optimal amount of C to compensate for the donor-type level of the nitride semiconductor such that it can have high resistance. The insertion of the GaN high-resistance layer 12 makes it possible to improve the breakdown voltage of the semiconductor device 100 in the epitaxial direction. The thickness of the GaN high-resistance layer 12 is, for example, about 1 µm.

The third nitride semiconductor layer 14 is provided on the GaN high-resistance layer 12. The third nitride semiconductor layer 14 is a channel layer. The third nitride semiconductor layer 14 is, for example, an undoped $Al_xGa_{1-x}N$ ($0 \leq X < 1$) layer. Specifically, the third nitride semiconductor layer 14 is, for example, an undoped GaN layer. The thickness of the third nitride semiconductor layer 14 is, for example, about 500 nm.

The fourth nitride semiconductor layer 16 is provided on the third nitride semiconductor layer 14. The fourth nitride semiconductor layer 16 is a barrier layer. The bandgap of the fourth nitride semiconductor layer 16 is greater than the bandgap of the third nitride semiconductor layer 14. The fourth nitride semiconductor layer 16 is, for example, an undoped $Al_yGa_{1-y}N$ ($0 < Y < 1$, $X < Y$) layer. Specifically, the fourth nitride semiconductor layer 16 is, for example, an undoped $Al_{0.2}Ga_{0.8}N$ layer. The thickness of the fourth nitride semiconductor layer 16 is, for example, about 30 nm.

A two-dimensional electron gas (2DEG) is formed in the third nitride semiconductor layer in the vicinity of a heterojunction interface between the third nitride semiconductor layer 14 and the fourth nitride semiconductor layer 16. Therefore, the semiconductor device 100 functions as an HFET.

The source electrode (an example of a main electrode or a first main electrode) 20 is provided on the fourth nitride semiconductor layer 16. The drain electrode (an example of the main electrode or a second main electrode) 24 is provided on the fourth nitride semiconductor layer 16. The insulating film 18 is provided on the fourth nitride semiconductor layer 16 between the source electrode 20 and the drain electrode 24. The gate electrode (an example of a control electrode) 22 is provided on the insulating film 18.

It is preferable that the source electrode 20 and the drain electrode 24 come into ohmic contact with the fourth nitride semiconductor layer 16. The distance between the source electrode 20 and the drain electrode 24 is, for example, equal to or greater than 5 µm and equal to or less than 50 µm. In addition, an electrode having an ohmic contact with the substrate 2 may be provided below the substrate 2, which is not particularly illustrated.

The insulating film 18 is a gate insulating film. It is preferable that the insulating film 18 is, for example, any one of a silicon nitride ($SiN_x$) film, a silicon oxide ($SiO_x$) film, an AlN film, and an aluminum oxide ($AlO_x$) film.

It is preferable that the source electrode 20, the drain electrode 24, and the gate electrode 22 are metal electrodes having a stacked structure including, for example, titanium (Ti) and aluminum (Al).

The configuration aspect of the source electrode 20, the drain electrode 24, the gate electrode 22, and the insulating film 18 is not limited to the above. The electrodes can be preferably used as long as they can be used for an HFET using a nitride semiconductor.

FIGS. 2A to 2F are diagrams illustrating the analysis results of the cross sections of the substrate 2, the second nitride semiconductor layer 4, and the first nitride semiconductor layer 6 in the semiconductor device 100 according to the embodiment. FIG. 2A illustrates a high-angle annular dark field scanning transmission electron microscope (HAADF-STEM) image of the cross sections of the substrate 2, the second nitride semiconductor layer 4, and the first nitride semiconductor layer 6. FIG. 2B illustrates a high-resolution transmission electron microscope (HR-TEM) image of the cross sections of the substrate 2, the second nitride semiconductor layer 4, and the first nitride semiconductor layer 6. FIGS. 2C, 2D, 2E, and 2F illustrate the results of fast Fourier transform (FFT) analysis for the first nitride semiconductor layer 6, the upper parts of the second nitride semiconductor layer 4, the vicinity of the interface between the second nitride semiconductor layer 4 and the substrate 2, and the substrate 2, with a length of 10 nm in a direction parallel to the substrate plane and the horizontal direction (the x direction and an example of a first direction) of the plane of paper in FIGS. 2A and 2B and with a width of several atomic layers in a direction perpendicular to the substrate plane and the vertical direction (z direction) of the plane of paper in FIGS. 2A and 2B. In other words, FIGS. 2C, 2D, 2E, and 2F correspond to a transmission electron beam diffraction spot in a region with a width of several atomic layers and a length of 10 nm. In FIGS. 2A to 2F, the thickness of a sample (a thickness in the depth direction of the plane of paper) is 50 nm and FFT analysis also includes information in the depth direction of the plane of paper (the y direction and an example of a second direction). In FIGS. 2A to 2F, the substrate 2 is a Si (111) substrate and the first nitride semiconductor layer 6 is an AlN layer.

A lattice period corresponding to the diffraction spot illustrated in FIG. 2C is the lattice period (an example of a first lattice period) of AlN.

In FIG. 2D, diffraction spots are observed at ⅓ and ⅔ of the diffraction spot corresponding to the lattice period of AlN in addition to the diffraction spot corresponding to the lattice period of AlN. Here, as described above, FIG. 2D illustrates the result of FFT analysis. Therefore, the observation of diffraction spots at ⅓ and ⅔ of the diffraction spot corresponding to the lattice period of AlN means that, in a real space, the second nitride semiconductor layer 4 includes a lattice period that is three times the lattice period of AlN. The lattice period that is three times the lattice period of AlN is an example of a second lattice period. However, the second nitride semiconductor layer 4 is not necessarily formed by only the lattice period that is three times the lattice period of AlN and it is considered that the lattice period structure of AlN and a lattice period structure that is three times the lattice period structure of AlN are mixed.

In FIG. 2F, a diffraction spot corresponding to the lattice period of the Si (111) face is observed. The lattice period of the Si (111) face is an example of a third lattice period.

In FIG. 2E, the diffraction spot corresponding to the lattice period of the Si (111) face observed in FIG. 2F is observed in addition to the diffraction spot corresponding to the lattice period of AlN and the diffraction spot corresponding to the lattice period that is three times the lattice period of AlN. As the reason, the following is considered. Even in a case in which a substrate whose surface has been planarized by polishing is used as the substrate 2, the surface (substrate plane) of the substrate 2 is not completely flat, but has an unevenness of about several atomic layers. Therefore, a diffraction spot corresponding to the lattice period of the Si (111) face is observed in an interface portion of the second nitride semiconductor layer 4 which comes into direct contact with the substrate 2. That is, the surface (substrate plane) of the substrate 2 may have unevenness. Furthermore, the unevenness is not limited to the value corresponding to about several atomic layers and a substrate on which an uneven portion is intentionally formed by etching or a heat treatment may be used. In addition, the semiconductor device 100 has the second lattice period and the third lattice period in the first direction including the interface between the substrate 2 and the second nitride semiconductor layer 4. Further, it is considered that $SiN_x$ is not present at the interface between the substrate 2 and the second nitride semiconductor layer 4 since the diffraction spot of $SiN_x$ ($0<x\leq4/3$) is not observed in FIG. 2E. Therefore, it is considered that dislocation density is not reduced through $SiN_x$. Further, in this embodiment, it is considered that, since a diffraction spot of an oxide film, such as a natural oxide film $SiO_x$ ($0<x\leq2$) or $AlO_x$ ($0<x\leq3/2$) of the Si substrate, is not observed at the interface between the substrate 2 and the second nitride semiconductor layer 4, no oxide films are present at the interface between the substrate 2 and the second nitride semiconductor layer 4.

For ease of understanding, assuming that the lattice period of the Si (111) face (third lattice period) observed in FIG. 2F is a lattice period corresponding to a lattice constant of 0.3840 nm of the Si (111) face, the lattice period observed in FIG. 2C corresponds to a lattice period of 0.3111 nm. This is matched with the lattice constant of the a-axis of AlN. Therefore, it can be said that AlN included in the first nitride semiconductor layer 6 is formed with the original lattice constant of AlN.

The incident direction of the transmission electron beam in the TEM image and the FFT image having the threefold period structure illustrated in FIGS. 2A to 2F may be observed in at least one of the a-axis direction and the m-axis direction. In other words, it is desirable to observe the incident direction in both the a-axis direction and the m-axis direction or in both the x-axis direction and the y-axis direction of the plane of paper. However, the incident direction may not be observed in both directions.

In FIG. 2A, in the second nitride semiconductor layer 4, there is a nitrogen-deficient region 4a (an example of a first region) which is visually seen in black since a light element (N element) is deficient in the vicinity of the Si substrate. A nitrogen-deficient region (second region) 4b which is brighter than the nitrogen-deficient region 4a is present above the nitrogen-deficient region (first region) 4a. As such, the composition ratio of the N element in the second nitride semiconductor layer 4 is lower than the composition ratio of the N element in the first nitride semiconductor layer 6.

In other words, for the nitrogen concentration of the second nitride semiconductor layer 4, the nitrogen concentration of the nitrogen-deficient region (second region) 4b that is provided above the nitrogen-deficient region 4a so as to be close to the first nitride semiconductor layer 6, is higher than the nitrogen concentration of the nitrogen-deficient region (first region) 4a provided close to the substrate 2.

The composition ratio of the Al element and the N element can be analyzed by, for example, electron energy-loss spectroscopy (EELS). In the case of observation with EELS, the nitrogen concentration of the second nitride semiconductor layer 4 gradually increases from the interface with the substrate 2 toward the interface with the first nitride semiconductor layer 6 and the composition ratio of the Al element and the N element at the interface with the first nitride semiconductor layer 6 is about 1:1. In contrast, the aluminum concentration of the second nitride semiconductor layer 4 sharply increases from the interface with the substrate 2 and is equal to the aluminum concentration of the first nitride semiconductor layer 6.

In the second nitride semiconductor layer 4, a diffraction spot corresponding to the lattice period of $SiN_x$ is not observed. In other words, the second nitride semiconductor layer 4 does not include $SiN_x$.

Next, a method for manufacturing the semiconductor device 100 according to the embodiment will be described.

First, for example, the second nitride semiconductor layer 4 including nitrogen and aluminum is formed on the substrate 2 which is a Si (111) substrate by an epitaxial growth method such as a metal organic vapor phase epitaxy method (MOCVD method). It is desirable that a natural oxide film on the plane of the substrate 2 is removed immediately before the second nitride semiconductor layer 4 is formed. The thickness of the second nitride semiconductor layer 4 is preferably equal to or less than 10 nm and more preferably equal to or less than 5 nm.

Then, the first nitride semiconductor layer 6 including nitrogen and aluminum is formed on the second nitride semiconductor layer 4 by, for example, the epitaxial growth method. In this case, the first nitride semiconductor layer 6 is formed in the direction of the c-axis (Al polarity) while maintaining the original a-axis lattice constant, 0.3111 nm, of AlN. The curvature radius of the warpage of the substrate 2 while the first nitride semiconductor layer 6 is formed is, for example, any value in the range of 20 km$^{-1}$ to 50 km$^{-1}$ in a downward convex direction. The value of the curvature radius is substantially constant and does not change for the period from the formation of the second nitride semiconductor layer 4 to the completion of the formation of the first nitride semiconductor layer 6.

The first nitride semiconductor layer 6 can be formed with a thickness of at least 300 nm.

Then, the AlGaN layer 8 is formed on the first nitride semiconductor layer 6 by, for example, the epitaxial growth method.

Then, an AlN film with a thickness of 10 nm and a GaN film with a thickness of 25 nm are alternately stacked 100 times on the AlGaN layer 8 by, for example, the epitaxial growth method to form the AlN/GaN superlattice semiconductor layer 10.

Then, the growth temperature is adjusted to, for example, the value at which a desired C concentration is obtained and the GaN high-resistance layer 12 is formed on the AlN/GaN superlattice semiconductor layer 10 by the epitaxial growth method. In addition, gas, such as methane, may be added to adjust the value to the desired C concentration.

Then, the third nitride semiconductor layer 14 is formed on the GaN high-resistance layer 12 by, for example, the epitaxial growth method.

Then, the fourth nitride semiconductor layer 16 is formed on the third nitride semiconductor layer 14 by, for example, the epitaxial growth method.

The amount of warpage of the 8-inch epitaxial wafer in the downward convex direction in a state in which the temperature is reduced to room temperature after the fourth nitride semiconductor layer 16 is formed on the substrate 2 by the epitaxial growth method at a high temperature is, for example, 10 μm and it is possible to prevent the epitaxial wafer from being cracked by optimizing a temperature reduction process. In addition, epitaxial growth conditions or the thickness of the nitride semiconductor layer is adjusted to the warpage of the epitaxial wafer in the range of 50 μm in the upward convex direction to 50 μm in the downward convex direction. Therefore, even in a case in which a general-purpose semiconductor process is used, there are no problems in all processes including, particularly, wafer handling and a lithography process.

Then, the insulating film 18, the source electrode 20, the drain electrode 24, and the gate electrode 22 are formed on the fourth nitride semiconductor layer 16 to obtain the semiconductor device 100 according to the embodiment.

In the semiconductor device 100 formed in this way, in a case in which the first nitride semiconductor layer 6 is made of AlN, the full width at half maximum of an X-ray rocking curve (XRC-FWHM) for AlN (002) is 800 arcsec or less.

This shows that the dislocation density of the first nitride semiconductor layer 6 is low. In addition, in a case in which the third nitride semiconductor layer 14 is made of undoped GaN, the full width at half maximum of an X-ray rocking curve (XRC-FWHM) for both GaN (002) and GaN (102) is 300 arcsec or less. This shows that the dislocation density of the third nitride semiconductor layer 14 is a low value of $5 \times 10^8$ cm$^{-2}$ or less.

Next, functions and effects of the embodiment will be described.

Figure 3A:
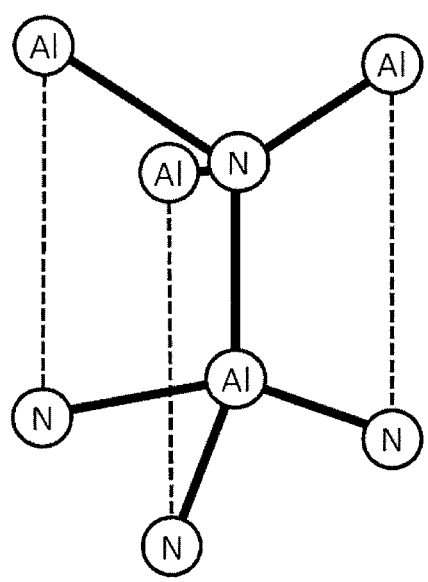
FIGS. 3A and 3B are diagrams schematically describing an AlN crystal structure of the second nitride semiconductor layer.
Figure 3B:
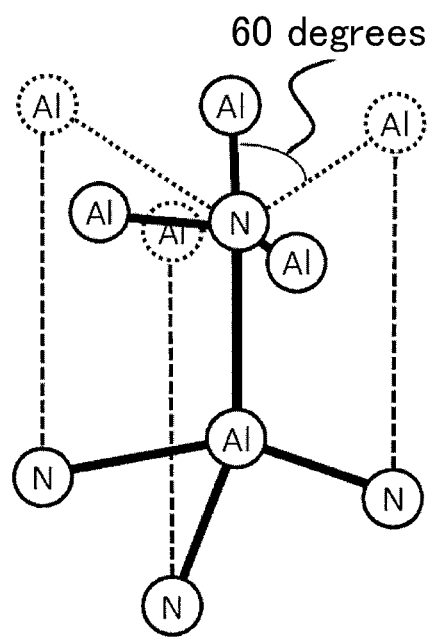

FIGS. 3A and 3B are diagrams schematically describing the AlN crystal structure of the second nitride semiconductor layer 4. In general, in a case in which the crystals of a nitride semiconductor including AlN are grown by an epitaxial growth method, such as an MOCVD method, in AlN, as illustrated in FIG. 3A, both Al atoms and N atoms are ionized to attract each other and the Al atoms are disposed directly above the N atoms to form a wurtzite crystal structure. A wurtzite crystal and a zinc blend crystal have in common that they are four-coordinate bonds, but differ from each other in that a relative difference between atomic bonds is 60 degrees due to a difference in ionicity. In a case in which the crystals are not ionized, they become zinc blend crystals. FIG. 3B illustrates the crystal structure in a case in which the Al atoms and the N atoms are not ionized with respect to the wurtzite crystal, and three Al atoms bonded onto the N atom are rotated by 60 degrees with respect to the wurtzite crystal. There is known a document showing the boundary between the wurtzite crystal and the zinc blend crystal estimated from the relationship between the bandgap energy of a covalent bond and the bandgap energy of an ionic bond. All nitride semiconductors, such as AlN, GaN, and InN, have the wurtzite crystal structure. However, the nitride semiconductors are located on the wurtzite crystal structure side slightly from a boundary line between the crystals. Therefore, in a case in which the epitaxial growth conditions are adjusted to perform absorption without ionizing the N atoms, it is possible to form the Al atoms so as to be rotated by 60 degrees with respect to the wurtzite crystal. As described above, it is preferable that the nitrogen composition in the second nitride semiconductor layer 4 increases gradually from the interface with the substrate 2 toward the interface with the first nitride semiconductor layer 6. Therefore, the ionicity of atomic bonds is weak at the interface with the substrate 2 and it is preferable to ionize nitrogen toward the first nitride semiconductor layer 6. A lattice period that is three times the lattice period of the AlN crystal with the wurtzite structure can be obtained by the formation of the second nitride semiconductor layer 4 having the above-mentioned atomic bonds, which contributes to reducing dislocation and strain stress. In the xy plane of the second nitride semiconductor layer 4, all bonds above the N atoms are not formed so as to be rotated by 60° and an ionized region and a non-ionized region may be formed so as to be mixed with each other microscopically.

In the related art, the thickness of the first nitride semiconductor layer 6 has been limited to about 200 nm. However, the formation of the second nitride semiconductor layer 4 makes it possible to increase the thickness of the first nitride semiconductor layer 6 to at least about 300 nm. In the related art, the dislocation density starting from the interface between the substrate 2 and the first nitride semiconductor layer 6 is equal to or greater than $1 \times 10^9$/cm$^2$. However, the formation of the second nitride semiconductor layer 4 makes it possible to reduce the dislocation density to $5 \times 10^8$/cm$^2$ or less. In addition, as described above, it is possible to reduce the amount of warpage of the substrate 2.

Mainly since the dislocation density is reduced, it is possible to reduce the leak current of the semiconductor device 100. In addition, it is possible to increase a breakdown voltage in a direction perpendicular to the substrate plane. Furthermore, it is possible to significantly reduce degradation or breakage caused by the crystal defects of the nitride semiconductor and thus to provide a semiconductor device with high reliability.

According to the semiconductor device of the embodiment, it is possible to provide a semiconductor device including a high-quality nitride semiconductor layer.

In the semiconductor device according to the embodiment, a structure in which 2DEG is not generated in a case in which no voltage is applied to the gate electrode (an example of a control electrode) 22 may be provided between the third nitride semiconductor layer 14 and the gate electrode (an example of the control electrode) 22 of the semiconductor device 100 in order to obtain a normally-off operation. That is, the gate electrode 22 may be provided above the third nitride semiconductor layer 14. Examples of the semiconductor device are illustrated in FIGS. 4 and 5.

Figure 4:
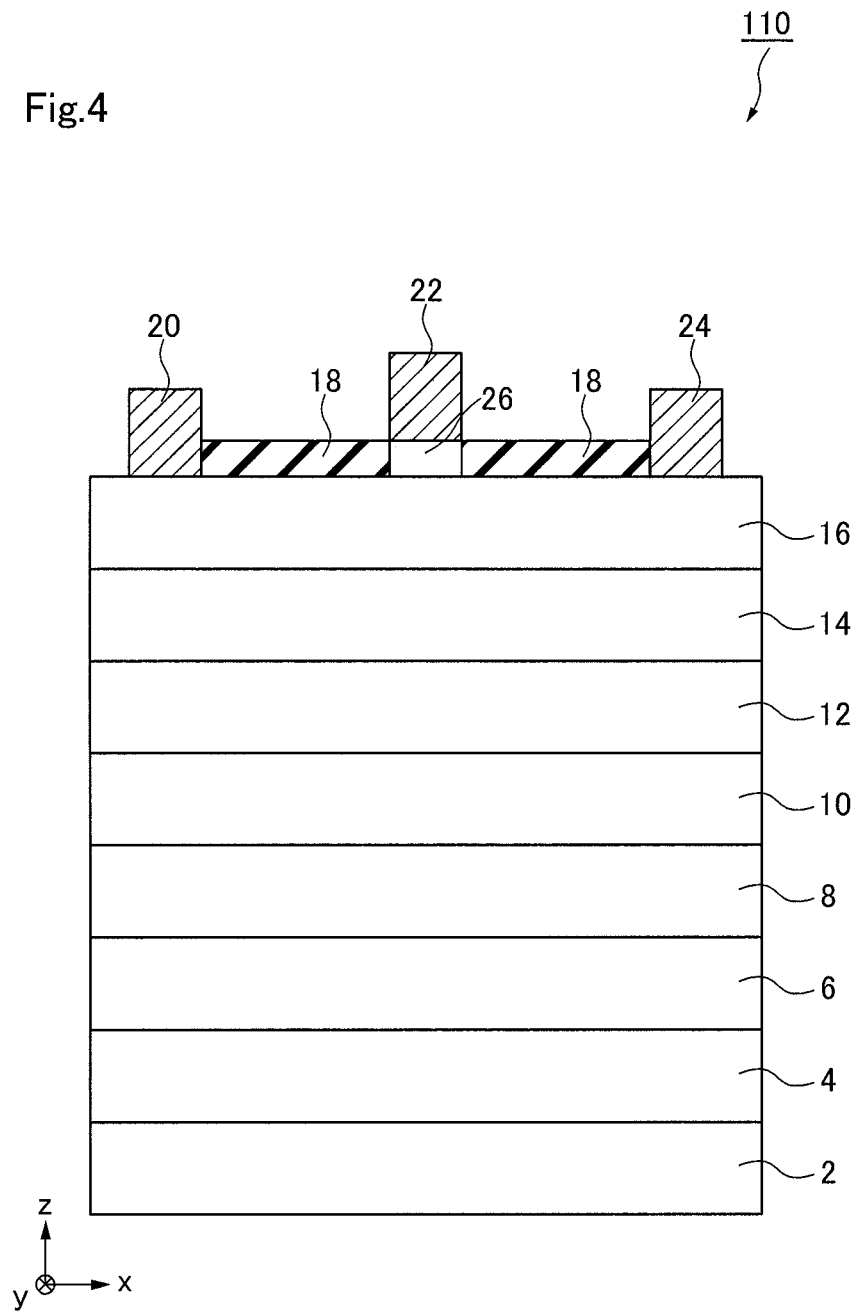
FIG. 4 is a cross-sectional view schematically illustrating a semiconductor device according to another aspect of the embodiment.

FIG. 4 is a cross-sectional view schematically illustrating a semiconductor device 110 according to another aspect of this embodiment. The semiconductor device 110 is a junction field effect transistor (JFET) using a nitride semiconductor. In the semiconductor device 110, a p-type nitride semiconductor layer 26 is provided on the fourth nitride semiconductor layer 16. The gate electrode 22 is provided on the p-type nitride semiconductor layer 26.

Figure 5:
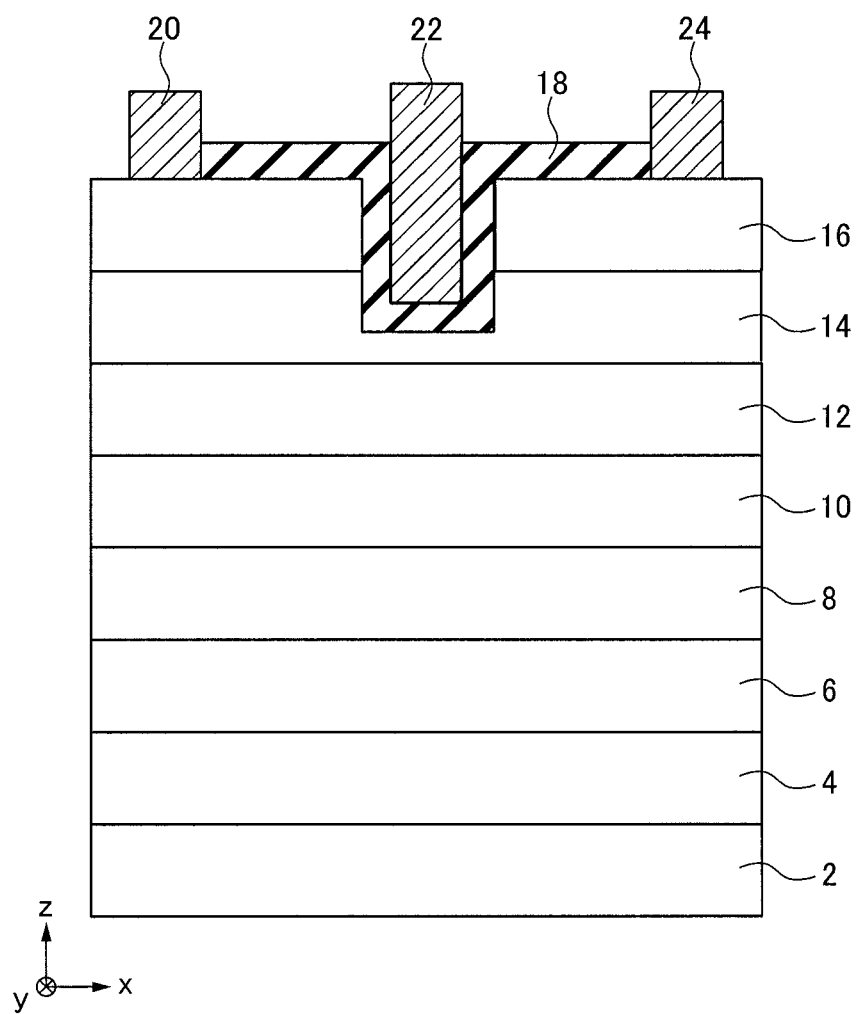
FIG. 5 is a cross-sectional view schematically illustrating a semiconductor device according to still another aspect of the embodiment.

FIG. 5 is a cross-sectional view schematically illustrating a semiconductor device 120 according to still another aspect of this embodiment. The semiconductor device 120 is a metal-insulator-semiconductor field effect transistor (MISFET) using a nitride semiconductor. In the semiconductor device 120, a trench that reaches the third nitride semiconductor layer 14 through, for example, the fourth nitride semiconductor layer 16 is formed between the source electrode 20 and the drain electrode 24. Then, the insulating film 18 is formed in the trench. In addition, the gate electrode 22 is formed on the insulating film 18 formed in the trench.

In addition, a field plate may be formed in order to reduce the electric field in a case in which a high voltage is applied to the semiconductor devices 100, 110 and 120.

The semiconductor device according to the embodiment can be applied as an RF semiconductor element in addition to a power semiconductor element such as a switching element.

While certain embodiments have been described, these embodiments have been presented by way of example only, and are not intended to limit the scope of the inventions. Indeed, SEMICONDUCTOR DEVICE described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    a substrate;
    a first nitride semiconductor layer provided above the substrate, the first nitride semiconductor layer having a first lattice period in a first direction parallel to a substrate plane, the first nitride semiconductor layer including nitrogen and aluminum;
    a second nitride semiconductor layer provided between the substrate and the first nitride semiconductor layer, at least a portion of the second nitride semiconductor layer having a second lattice period in the first direction parallel to the substrate plane, the second lattice period being three times the first lattice period, the second nitride semiconductor layer including nitrogen and aluminum;
    a third nitride semiconductor layer provided above the first nitride semiconductor layer;
    a fourth nitride semiconductor layer provided on the third nitride semiconductor layer, the fourth nitride semiconductor layer having a larger bandgap than the third nitride semiconductor layer;
    at least one main electrode provided on the fourth nitride semiconductor layer; and
    a control electrode provided above the third nitride semiconductor layer, the control electrode being configured to control a current of the semiconductor device.

2. The device according to claim 1,
    wherein the substrate is a silicon substrate and a plane direction of the substrate plane is (111).

3. The device according to claim 1,
    wherein a thickness of the second nitride semiconductor layer is equal to or less than 10 nm.

4. The device according to claim 1,
    wherein the substrate plane includes unevenness,
    wherein the device further comprises a third lattice period corresponding a lattice period of a silicon (111) face and the second lattice period,
    and wherein the second lattice period and the third lattice period are provided in the first direction including an interface between the substrate and the second nitride semiconductor layer.

5. The device according to claim 1,
    wherein the second nitride semiconductor layer further includes silicon.

6. The device according to claim 1,
    wherein, for a nitrogen concentration of the second nitride semiconductor layer, a nitrogen concentration of a first region close to the substrate is lower than a nitrogen concentration of a second region close to the first nitride semiconductor layer.

7. The device according to claim 1,
    wherein the second nitride semiconductor layer further includes the second lattice period three times the first lattice period in a second direction perpendicular to the first direction.

8. The device according to claim 1,
    wherein a thickness of the second nitride semiconductor layer is equal to or less than 10 nm.

9. The device according to claim 1, further comprising:
    two main electrodes provided on the fourth nitride semiconductor layer,
    wherein the control electrode is provided between the two main electrodes.

10. The device according to claim 1, further comprising:
    an insulating film provided between the fourth nitride semiconductor layer and the control electrode.

11. The device according to claim 1,
    wherein the first nitride semiconductor layer is made of AlN.

12. The device according to claim 1,
    wherein silicon nitride is absent at an interface between the substrate and the second nitride semiconductor layer.

13. The device according to claim 1,
wherein an oxide film is absent at an interface between the substrate and the second nitride semiconductor layer.

14. The device according to claim 1,
wherein a p-type nitride semiconductor layer is provided on the fourth nitride semiconductor layer, and
the control electrode is provided on the p-type nitride semiconductor layer.

15. The device according to claim 9, further comprising:
a trench provided between the two main electrodes; and
an insulating film provided in the trench,
wherein the control electrode is provided on the insulating film.

* * * * *